(12) United States Patent
Mori et al.

(10) Patent No.: US 8,159,829 B2
(45) Date of Patent: Apr. 17, 2012

(54) RELAY SUBSTRATE, METHOD FOR MANUFACTURING THE RELAY SUBSTRATE AND THREE-DIMENSIONAL CIRCUIT DEVICE USING THE RELAY SUBSTRATE

(75) Inventors: Masato Mori, Osaka (JP); Daido Komyoji, Nara (JP); Koichi Nagai, Kyoto (JP); Yoshihiko Yagi, Hyogo (JP)

(73) Assignee: Panasonic Corporation, Osaka (JP)

( * ) Notice: Subject to any disclaimer, the term of this patent is extended or adjusted under 35 U.S.C. 154(b) by 632 days.

(21) Appl. No.: 12/295,119

(22) PCT Filed: Mar. 23, 2007

(86) PCT No.: PCT/JP2007/056051
§ 371 (c)(1),
(2), (4) Date: Jan. 7, 2009

(87) PCT Pub. No.: WO2007/116657
PCT Pub. Date: Oct. 18, 2007

(65) Prior Publication Data
US 2009/0321122 A1 Dec. 31, 2009

(30) Foreign Application Priority Data
Apr. 10, 2006 (JP) .................................. 2006-107348

(51) Int. Cl.
*H05K 3/00* (2006.01)

(52) U.S. Cl. ........ 361/761; 361/767; 361/770; 361/790; 257/693; 257/737; 257/739

(58) Field of Classification Search .................. 361/761, 361/767, 770–790; 257/693, 52.1, 737–739
See application file for complete search history.

(56) References Cited

U.S. PATENT DOCUMENTS

| 7,258,549 | B2 | 8/2007 | Asahi et al. | |
| 2005/0168961 | A1* | 8/2005 | Ono et al. | 361/784 |
| 2005/0184381 | A1 | 8/2005 | Asahi et al. | |

FOREIGN PATENT DOCUMENTS

| CN | 1658439 | 8/2005 |
| JP | 1-135099 | 5/1989 |
| JP | 5-29784 | 2/1993 |
| JP | 09-246686 | 9/1997 |
| JP | 10-189869 | 7/1998 |

(Continued)

OTHER PUBLICATIONS

Japanese Office Action issued in Japanese Patent Application No. 2008-509725, dated Apr. 19, 2011.

(Continued)

*Primary Examiner* — Tuan Dinh
*Assistant Examiner* — Hung Dang
(74) *Attorney, Agent, or Firm* — McDermott Will & Emery LLP

(57) ABSTRACT

Relay substrate (1) connecting between at least a first circuit board and a second circuit board, including housing (10) having recess (10a) provided in the outer circumference and hole (22) provided in the inner circumference; plural connecting terminal electrodes (12a, 12c) connecting between the top and bottom surfaces of housing (10); shield electrode (11) provided in recess (10a); and ground electrode (13) provided on a part of the top and bottom surfaces of housing (10).

8 Claims, 11 Drawing Sheets

FOREIGN PATENT DOCUMENTS

| | | |
|---|---|---|
| JP | 2000-100496 | 4/2000 |
| JP | 2001-313125 | 11/2001 |
| JP | 2004-014651 | 1/2004 |
| JP | 2005-251889 | 9/2005 |
| JP | 2005-333046 | 12/2005 |
| JP | 2006-40870 | 2/2006 |

OTHER PUBLICATIONS

Chinese Office Action issued in Chinese Patent Application No. 200780011882X, mailed Jan. 8, 2010.

* cited by examiner ional Application No. PCT/JP2007/056051, filed on Mar. 23, 2007, which in turn claims the benefit of Japanese Application No. 2006-107348, filed on Apr. 10, 2006, the disclosures of which Applications are incorporated by reference herein.

TECHNICAL FIELD

The present invention relates to a relay substrate connecting between circuit boards on which electronic components such as an IC chip are mounted, to a method of manufacturing such relay substrates, and to a three-dimensional circuit device using the relay substrate.

BACKGROUND ART

Conventionally, board joint members (referred to as "relay substrate" hereinafter) for connecting between circuit boards such as a module board on which electronic components (e.g. IC chip, chip part) are mounted include a multi-contact connector (composed of a part as the plug side and that as the socket side) and a pin connector (contact pins are fixed onto a resin substrate).

In recent years, with miniaturization and higher functionality of such as mobile devices, there has been a trend in an increase of the number of connecting terminals between module boards. Accordingly, an effort is under way to reduce the pitch between connecting terminals of a pin connector. However, the joint part of a pin connector is undesirably likely to break due to the difference of dimensional fluctuations between the members composing the joint part when temperature changes or due to a large force when being subjected to an extraneous impact force.

Meanwhile, with higher speed and frequency of such as a mobile information device, the demand is growing for EMC (electromagnetic compatibility) against malfunctions due to extraneous electromagnetic waves or interference with other devices due to radiated electromagnetic waves. As a result, mounting technologies of circuit board for reliable electromagnetic shielding are highly demanded. In a relay substrate connecting circuit boards on which a high-frequency component such as a control IC chip is mounted, extraneous electromagnetic waves and those radiated from the inside of the high-frequency component need to be electromagnetically shielded reliably.

To solve these problems, a relay substrate is disclosed that fixedly retains lead terminals in a given shape, made of thin metal plates with a spring elasticity, onto an insulative housing in a preliminarily set arrangement (refer to patent document 1 for example).

In the board joint member presented in patent document 1, a lead terminal is partially embedded in the housing, where one end is exposed on the bottom end surface of the housing to form a bottom-end joint part; the other end is exposed on the housing wall and rises to form a deformable part. The external wall surface of the housing is provided thereon with a shielding member.

The document describes that this structure allows connecting between circuit boards at a fine pitch and largely improving the impact resistance. Further, the electronic component is electromagnetically shielded from such as noise with a shielding member provided on the relay substrate.

Meanwhile, as shown in FIG. 11, the example is disclosed where one main surface of dual surface-mounting printed-circuit board 600 has circuit component 610 for the tuner section requiring electromagnetic shielding, mounted thereon, and the other main surface has circuit component 620 for the VIF (video intermediate frequency) section, mounted thereon, where circuit component 610 for the tuner section is electromagnetically shielded by metal case 630 (refer to patent document 2 for example). The document describes that this structure allows reliably shielding a circuit component requiring electromagnetic shielding along with downsizing, reduction in profile, and slimming down.

However, the relay substrate according to patent document 1 arranges and fixedly retains lead terminals with spring elasticity, preliminarily formed in a given shape, onto an insulative housing, and the external wall surface of the insulative housing has a shielding member formed thereon. Although this structure improves fine-pitch connection and impact resistance, slimming down the relay substrate is difficult and the production cost increases.

According to patent document 2, the metal case and the main surface of the printed-circuit board can electromagnetically shield the circuit component. However, as an additional component for electromagnetic shielding, the metal case by itself increases the total weight and volume, which goes against the current of the times toward device miniaturization. Additionally, to mount circuit components at a high density, the metal case needs to be subjected to such as insulation process before mounting the components, which decreases the productivity and increases the production cost.

Patent document 2 does not disclose a technique of connecting plural circuit boards with such as a relay substrate.

[Patent document 1] Japanese Patent Unexamined Publication No. 2005-333046
[Patent document 2] Japanese Patent Unexamined Publication No. H05-29784

SUMMARY OF THE INVENTION

The relay substrate of the present invention is that connecting between at least a first circuit board and a second circuit board, including a housing having a recess provided in the outer circumference and a hole provided in the inner circumference; plural connecting terminal electrodes connecting between the top and bottom surfaces of the housing; a shield electrode provided in the recess; and a ground electrode provided on a part of the top and bottom surfaces of the housing connecting to the shield electrode.

This configuration provides a relay substrate connecting between circuit boards, thin, superior in noise immunity owing to the shield electrode. Further, the ground electrode connected to the shield electrode implements a relay substrate that easily connects between the circuit boards.

The method of manufacturing relay substrates, of the present invention includes forming plural first holes at least in a given position of an insulative mother board; forming at least one second hole in a region enclosed with the first holes; forming a shield electrode at least on the inner circumferential side of a first hole; forming plural connecting terminal electrodes connecting between the top and bottom surfaces of the insulative mother board; forming a ground electrode on a given region of the top and bottom surfaces of the insulative mother board connecting to the shield electrode; and dividing the insulative mother board into a region including at least one second hole.

With the method, the relay substrate including the shield electrode connecting between circuit boards is produced at low cost by the simple method of forming the connecting terminal electrodes, the shield electrode, and the ground electrode collectively on an insulative mother board and of dividing the insulative mother board.

A three-dimensional circuit device of the present invention is structured so that at least a first circuit board and a second one are connected to each other through the above-described relay substrate. This structure provides a three-dimensional circuit device connecting between circuit boards while electromagnetically shielding a circuit component mounted on a circuit board.

Figure 1A:
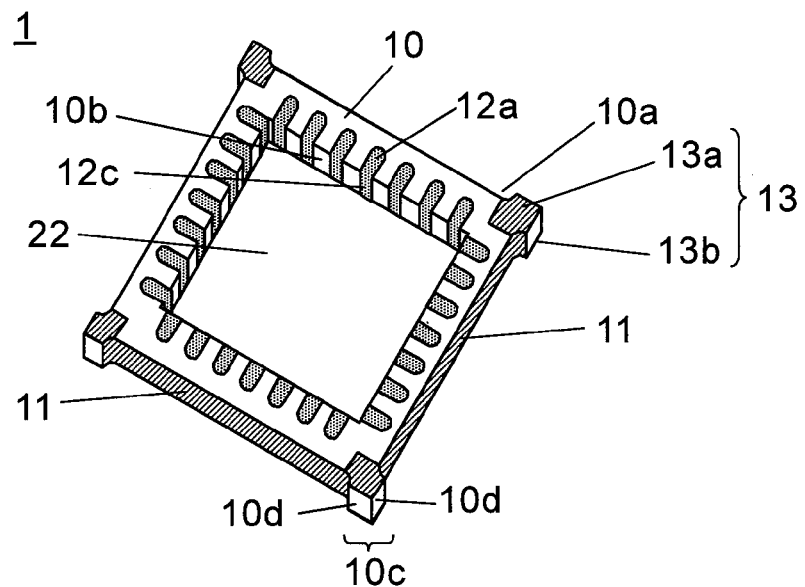
FIG. 1A is a conceptual perspective view showing the configuration of a relay substrate according to the first exemplary embodiment of the present invention.

REFERENCE MARKS IN THE DRAWINGS 1, 2, 3 Relay substrate
10, 40, 70 Housing
10a, 40a, 70a Recess
10b, 21a, 51a, 70b, 81a Inner circumferential side
10c, 40c, 70c Projection part
10d Separating section
11, 41, 71 Shield electrode
12 Connecting terminal electrode
12a Top surface terminal electrode
12b Bottom surface terminal electrode
12c Connection electrode
13, 43, 73 Ground electrode
13a, 43a, 73a Top-surface ground electrode
13b, 43b, 73b Bottom-surface ground electrode
20, 50, 80 Insulative mother board
21, 51, 81 First hole
21b, 5ib, 81b Hole end portion
22, 45, 85 Second hole (hole)
42, 72 Conductive via
52, 82 Via hole
71a First shield electrode
71b Second shield electrode
100 Three-dimensional circuit device
101 First circuit board
102 Second circuit board
103 Circuit component
104, 105 Wiring pattern
106, 107 Ground wiring pattern

DETAILED DESCRIPTION OF PREFERRED EMBODIMENTS

Hereinafter, a description is made for some exemplary embodiments of the present invention with reference to the related drawings.

First Exemplary Embodiment

Figure 1B:
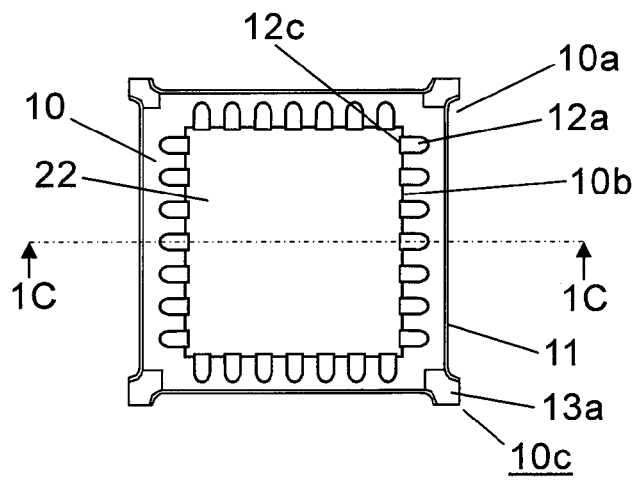
FIG. 1B is a conceptual plan view of FIG. 1A.
Figure 1C:
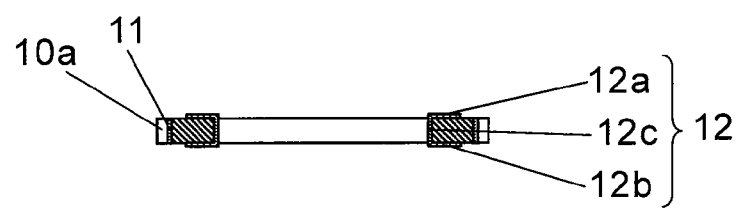
FIG. 1C is a conceptual sectional view of FIG. 1B taken along line 1C-1C.

FIG. 1A is a conceptual perspective view showing the configuration of a relay substrate according to the first exemplary embodiment of the present invention. FIG. 1B is a conceptual plan view of FIG. 1A. FIG. 1C is a conceptual sectional view of FIG. 1B taken along line 1C-1C.

As shown in FIGS. 1A through 1C, relay substrate 1, having an outer circumference, quadrangle shape for example, includes recess 10a formed by dividing using a first hole described in the following manufacturing method; and housing 10 having hole (written as "second hole" hereinafter) 22, quadrangle shape for example, made of such as a glass epoxy resin. Then, the entire inner circumferential side of recess 10a is provided thereon with shield electrode 11. Relay substrate 1 further includes one or more connecting terminal electrodes 12 integrally provided continuously with the top and bottom surfaces of housing 10 through the inner circumferential side of second hole 22. Additionally, ground electrodes 13 connected to shield electrodes 11 formed in recess 10a are provided in given regions at the four corners, for example.

Here, the top and bottom surfaces of housing 10 refer to a surface on which top-surface terminal electrode 12a is provided and that on which bottom-surface terminal electrode 12b is provided, of connecting terminal electrode 12 (to be described later), respectively. The given regions at four corners in which ground electrodes 13 are provided refer to the regions near the four corners of the housing divided using a first hole described in the following manufacturing method.

Here, housing 10 of relay substrate 1 is made of an insulative resin such as a glass epoxy resin, liquid crystal polymer, polyphenylene sulfide, polybutylene terephthalate or the like. When a high shape accuracy and/or heat transfer performance are required, an insulative substrate such as a ceramic substrate may be used, where especially a ceramic substrate superior in workability is preferable.

Shield electrode 11 (excluding separating section 10d of projection part 10c of housing 10 of relay substrate 1) is formed from a metal electrode material such as copper (Cu), silver (Ag), aluminum (Al) or the like.

Connecting terminal electrode 12 is provided so that top-surface terminal electrode 12a and bottom-surface terminal electrode 12b, facing the top and bottom surfaces of housing 10, respectively, are integrally connected to each other through connection electrode 12c formed on inner circumferential side 10b of second hole 22. Then, they are pattern-formed from the metal electrode material same as that of shield electrode 11.

Ground electrode 13 is composed of top-surface ground electrode 13a and bottom-surface ground electrode 13b, facing the top and bottom surfaces of projection part 10c such as at the four corners of housing 10, respectively, and pattern-formed from the metal electrode material same as that of shield electrode 11. Then, ground electrode 13, composed of top-surface ground electrode 13a and bottom-surface ground electrode 13b, is electrically connected to shield electrode 11 provided in recess 10a of housing 10.

Here, shield electrode 11, connecting terminal electrode 12, and ground electrode 13 are preferably gold-plated, for example, on their surfaces. This increases the connection stability and prevents the time degradation of each electrode, thereby improving the reliability.

With the above-described configuration, shield electrode 11 formed in recess 10a of relay substrate 1 that connects between circuit boards (not shown) through connecting terminal electrode 12 and ground electrode 13 with relay substrate 1 placed therebetween provides relay substrate 1 with an electromagnetic shielding effect.

That is, shield electrode 11 of relay substrate 1 shields circuit components mounted on the circuit board, for example, from external noise; and shields radiating of internal noise generated by circuit components by themselves from the inside of relay substrate 1 to the outside, in second hole 22 of relay substrate 1.

Connecting terminal electrode 12 and ground electrode 13 of relay substrate 1 are connected to circuit boards through such as solder, an anisotropic conductive sheet, or anisotropic conductive resin, thereby connecting between circuit boards with high reliability.

Relay substrate 1 provided with shield electrode 11 in recess 10a dispenses with an additional component such as a metal case, thus implementing weight reduction and slimming down.

Hereinafter, a description is made for a method of manufacturing relay substrates according to the first exemplary embodiment of the present invention, using FIGS. 2A through 2C and FIGS. 3A through 3C.

FIGS. 2A through 2C and FIGS. 3A through 3C are conceptual diagrams illustrating a method of manufacturing relay substrates according to the first exemplary embodiment of the present invention. Here, a component or part same as that in FIG. 1A through FIG. 1C is described with the same reference mark given.

Figure 2A:
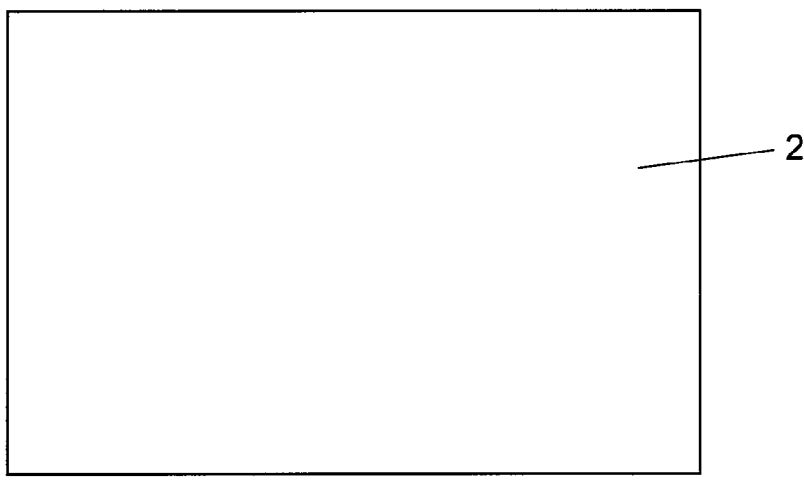
FIG. 2A is a conceptual diagram showing a method of manufacturing relay substrates according to the first exemplary embodiment of the present invention.

First, as shown in FIG. 2A, insulative mother board 20 made of a glass epoxy resin, for example, is prepared.

Figure 2B:
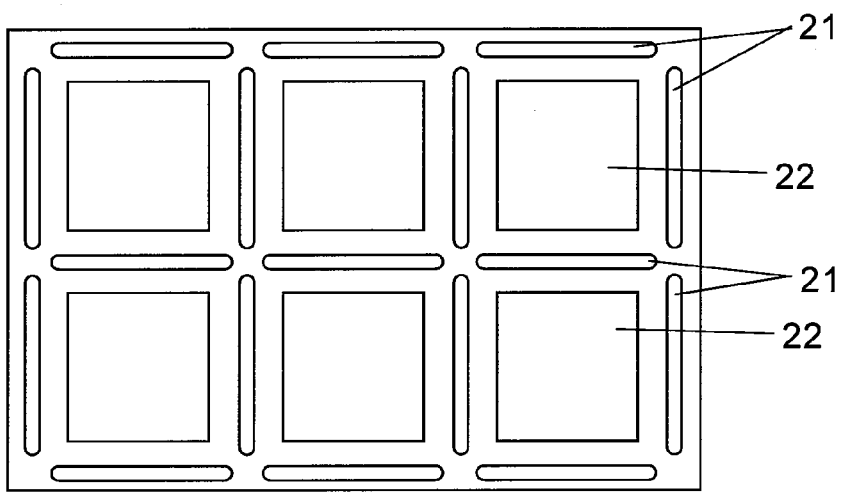
FIG. 2B is a conceptual diagram showing a method of manufacturing relay substrates according to the first exemplary embodiment of the present invention.

Next, as shown in FIG. 2B, plural first holes 21, long-shaped for example, for dividing provided in at least a given position are formed by stamping using such as a press machine. Then, second holes 22, quadrangle shape for example, enclosed with first holes 21 are formed by stamping using such as a press machine. At this moment, first holes 21 and second holes 22 may be formed either simultaneously or one after another.

Figure 2C:
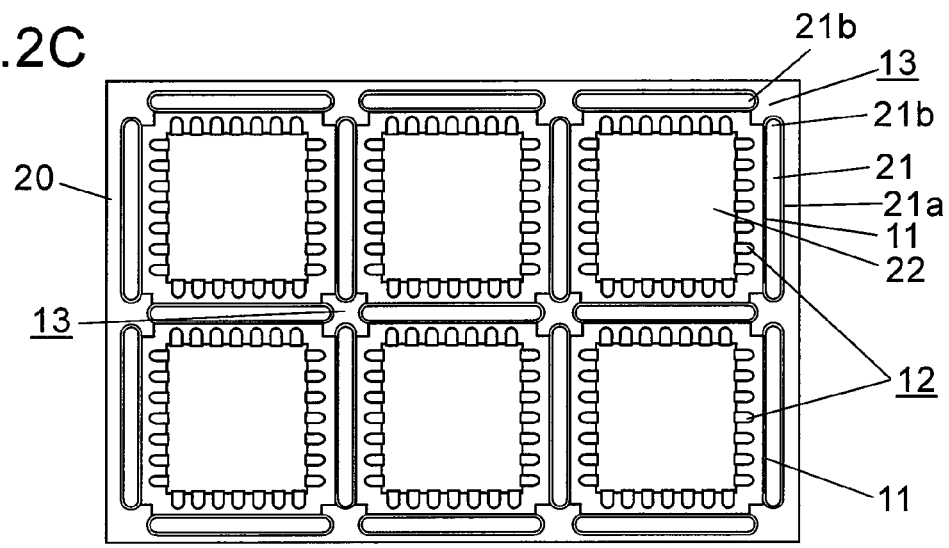
FIG. 2C is a conceptual diagram showing a method of manufacturing relay substrates according to the first exemplary embodiment of the present invention.

Next, as shown in FIG. 2C, shield electrode 11 is formed on inner circumferential side 21a of first hole 21. Plural connecting terminal electrodes 12 each composed of a top-surface terminal electrode, connection electrode, and bottom-surface terminal electrode are formed on the top and bottom surfaces of housing 10 and on the inner circumferential side of second hole 22. Further, ground electrode 13 composed of the top and bottom surfaces ground electrodes connecting to shield electrode 11 is formed in a given region of the top and bottom surfaces of insulative mother board 20 (e.g. a region where hole end portion 21b of first hole 21 lies next to another).

Here, shield electrodes 11, connecting terminal electrodes 12, and ground electrodes 13 are collectively formed on insulative mother board 20 by the following method.

That is, they are formed on insulative mother board 20 at given positions in given patterns from a metal electrode material such as copper by photolithographic method, for example.

Concretely, copper is pattern-formed by the following method (not shown).

First, the top and bottom surfaces of insulative mother board 20, and the inner circumferential sides (end surface) of first holes 21 and second holes 22 are roughened, and a plating catalyst such as palladium salt is applied onto the entire surfaces.

Next, a copper-plated layer of a given thickness is formed by electroless copper plating or a combination of electroless plating and electrolytic copper plating.

Next, a resist for etching is applied onto the copper-plated layer formed, and the layer is radiated with ultraviolet light to be exposed in a given pattern.

Next, development of the resist exposed, etching of the copper-plated layer, and exfoliation of the resist are executed sequentially to form a copper pattern.

Hereinafter, a further concrete description is made for a method of forming a copper pattern.

First, palladium salt is applied onto the entire surface of insulative mother board 20 in which first holes 21 and second holes 22 are formed.

Next, insulative mother board 20 is immersed in an electroless copper plating solution (shown below) for 7 hours to deposit copper of a thickness of approximately 35 µm. As the electroless copper plating solution, a mixture of copper sulfate pentahydrate, ethylenediamine tetraacetic acid, polyethylene glycol, l2.2-dypyridyl, and formaldehyde is adjusted to pH 12.5 by sodium hydroxide and used at a solution temperature of 70° C.

Next, as the resist for etching, an electrodeposited resist (e.g. "Photo ED P-1000" by Nippon Paint Co., Ltd) is electrodeposited at 25° C. at 50 mA/dm² for 3 minutes to apply in a thickness of approximately 8 µm.

Next, a light-shield mask is attached onto the resist, which is then radiated with ultraviolet light (scattering light) at approximately 400 mJ/cm² to be exposed in a given pattern. After that, 1% sodium metasilicate at 32° C. is sprayed for 120 seconds with spray equipment, and the resist is developed to be formed in a given pattern such as that with a width of 150 µm.

Next, the insulative mother board is immersed in a 36% solution of ferric chloride at 40° C. for 2 to 3 minutes to etch the copper. After that, 5% sodium metasilicate at 50° C. is sprayed for 120 seconds to exfoliate the resist.

By the above-described method, shield electrode 11 is formed by copper plating on inner circumferential side 21a of first hole 21 of insulative mother board 20. Then, plural connecting terminal electrodes 12 are formed by connecting top-surface terminal electrode 12a, connection electrode 12c, and bottom-surface terminal electrode 12b, formed on inner circumferential side 10b of second hole 22 and on the top and bottom surfaces of insulative mother board 20. As ground electrode 13, top-surface ground electrode 13a and bottom-surface ground electrode 13b are formed in a pattern facing a region of the top and bottom surfaces of insulative mother board 20 (e.g. a region where hole end portion 21b of first hole 21 lies next to another) connecting to shield electrode 11.

In this exemplary embodiment, the description is made for the example where connecting terminal electrode 12, shield electrode 11, and ground electrode 13 are collectively formed simultaneously, but not limited to. They may be formed one after another.

In this exemplary embodiment, the following method may be used. That is, a bond promoting layer (e.g. a combination of an epoxy resin, synthetic rubber, cross-linker, curing agent, and filler) is formed on the top and bottom surfaces of the insulative mother board and on the inner circumferential sides of the first and second holes, their surfaces are roughened, and then plated. This method improves the adhering strength of plating onto the surface of the insulative mother board.

Further, the patterned surfaces of the shield electrodes, connecting terminal electrodes, and ground electrodes may be gold-plated. This improves reliability such as the connection stability and moisture resistance.

Figure 3A:
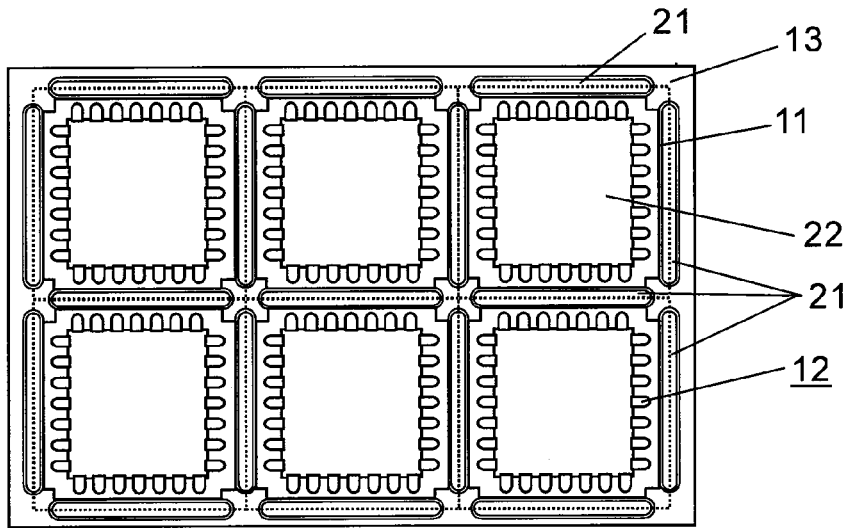
FIG. 3A is a conceptual diagram showing a method of manufacturing relay substrates according to the first exemplary embodiment of the present invention.

Next, as shown in FIG. 3A, relay substrates 1 are produced by dividing insulative mother board 20 at a region including at least one second hole 22 along the broken line shown in the drawing, for example, using first hole 21 formed in insulative mother board 20. Here, to divide, a method such as stamping or dicing is used.

Figure 3B:
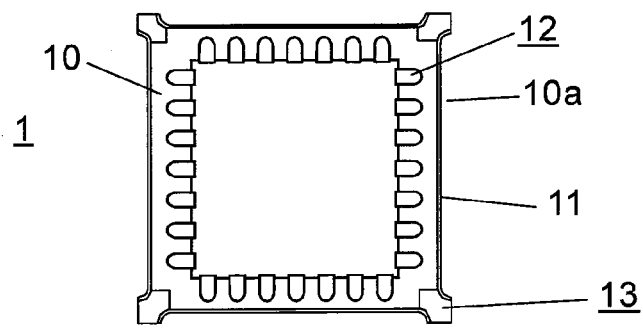
FIG. 3B is a conceptual diagram showing a method of manufacturing relay substrates according to the first exemplary embodiment of the present invention.
Figure 3C:
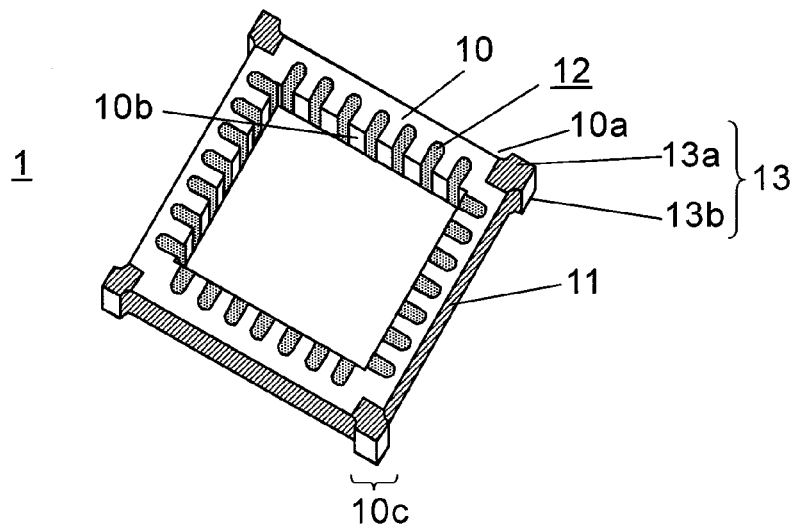
FIG. 3C is a conceptual diagram showing a method of manufacturing relay substrates according to the first exemplary embodiment of the present invention.

As shown in the conceptual plan view of FIG. 3B and the conceptual perspective view of FIG. 3C, the above-described dividing collectively produces plural relay substrates 1 having shield electrode 11 that connects between circuit boards, for example, in recess 10a formed by dividing a first hole.

By the above-described method, relay substrates 1 can be collectively produced including shield electrode 11 provided in recess 10a of housing 10 formed from an insulative mother board made of a glass epoxy resin; plural connecting terminal electrodes 12 provided on housing 10; and ground electrode 13 connected to shield electrode 11.

Here, ground electrode 13 is preferably provided on projection part 10c formed by dividing insulative mother board 20 for efficient use of space, but its position is not especially restricted.

According to the first exemplary embodiment of the present invention, relay substrates including a shield electrode that connects between circuit boards are produced with high productivity at low cost by the simple method of dividing an insulative mother board after each electrode is directly formed on the board.

In this exemplary embodiment, the description is made assuming a first hole is long-shaped and a second hole is quadrangle shape such as a square, but not limited to. They may be appropriately designed holes such as a polygon, a polygon with rounded vertexes, round shape, or ellipsoidal shape, where the same advantages are available.

In this exemplary embodiment, the description is made for the example where each electrode is formed using photolithographic technique and etching technique by a combination of electroless plating and electrolytic plating, but not limited to. Any method can be applied without any particular restrictions as long as it pattern-forms with such as a given film thickness. Further, the description is made for the example where a connecting terminal electrode is composed of a top surface terminal electrode, a connection electrode, and a bottom surface terminal electrode, but not limited to. For example, connection may be made only by a connection electrode formed on the inner circumferential side of a second hole. Alternatively, a connecting terminal electrode may be formed by the following method. That is, plural through holes are formed at a position where a connecting terminal electrode is provided before a second hole is formed, for example, using the method for forming an end surface electrode. After copper plating the through holes by plating method, a position between the central parts of the through holes is cut to form second holes. These methods produce relay substrates with higher productivity.

In this exemplary embodiment, an insulative protective film such as a resist may be provided on a part excluding that electrically connected with connecting terminal electrodes and ground electrodes formed on the top and bottom surfaces of the housing of the relay substrate. This prevents a short circuit caused by migration and damage to the electrodes at mounting and during storage.

Second Exemplary Embodiment

Figure 4A:
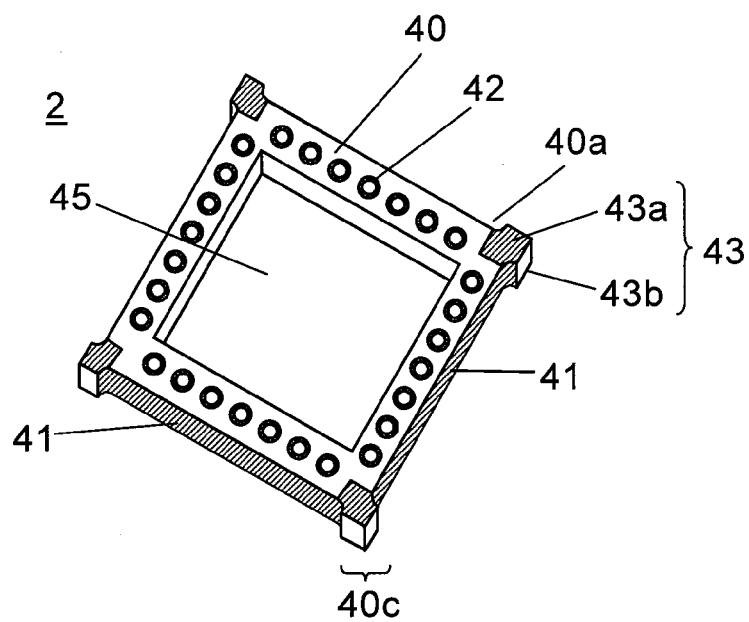
FIG. 4A is a conceptual perspective view showing the configuration of a relay substrate according to the second exemplary embodiment of the present invention.
Figure 4B:
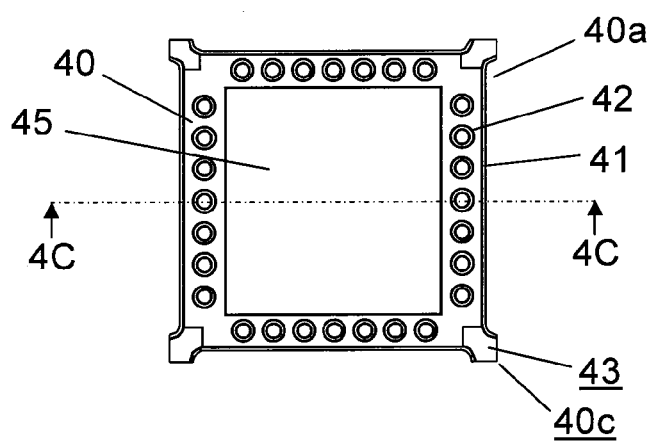
FIG. 4B is a conceptual plan view of FIG. 4A.
Figure 4C:
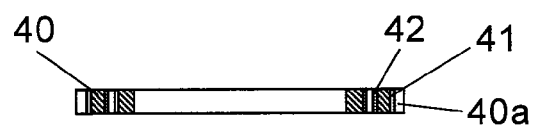
FIG. 4C is a conceptual sectional view of FIG. 4B taken along line 4C-4C.

FIG. 4A is a conceptual perspective view showing the configuration of a relay substrate according to the second exemplary embodiment of the present invention. FIG. 4B is a conceptual plan view of FIG. 4A. FIG. 4C is a conceptual sectional view of FIG. 4B taken along line 4C-4C.

As shown in FIGS. 4A through 4C, relay substrate 2, having an outer circumference, quadrangle shape for example, includes recess 40a formed by dividing using a first hole described in the following manufacturing method; and housing 40 having second hole 45, quadrangle shape for example, made of such as a glass epoxy resin. Then, the entire inner circumferential side of recess 40a is provided thereon with shield electrode 41. Ground electrode 43 composed of top surface ground electrode 43a and bottom surface ground electrode 43b connected to shield electrode 41 formed in recess 40a is provided on projection part 40c in given regions at four corners, for example, of relay substrate 2. Further, housing 40 is provided I given positions with plural (for example) conductive vias 42 which will be connecting terminal electrodes connecting between its top and bottom surfaces.

Here, the top and bottom surfaces of housing 40 refer to surfaces in which conductive via 42 (described later) is provided.

Housing 40, shield electrode 41, and ground electrode 43, of relay substrate 2 are formed from the same material by the same method as in the first exemplary embodiment.

Here, conductive vias 42 becoming connecting terminal electrodes are provided so as to electrically connect between the top and bottom surfaces of housing 40 through plural via holes (not shown) formed between second holes 45 provided in the outer and inner circumferences of housing 40. Then, conductive vias 42 are formed by such as copper plating in via holes having a land (not shown) on the top and bottom surfaces of housing 40.

With the above-described method, relay substrate 2 is produced that has an electromagnetic shielding effect by shield electrode 41 formed in recess 40a of relay substrate 2, that connects between circuit boards through conductive via 42 and ground electrode 43 with relay substrate 2 placed therebetween.

That is, shield electrode 41 of relay substrate 2 shields circuit components (not shown) mounted on the circuit board, for example, from external noise; and shields radiating of internal noise generated by circuit components by themselves from the inside of the relay substrate 2 to the outside, in second hole 45 of relay substrate 2.

Conductive via 42 and ground electrode 13 of relay substrate 2 are connected to circuit boards through such as solder, an anisotropic conductive sheet, or anisotropic conductive resin, thereby connecting between circuit boards with high reliability.

Relay substrate 2 provided with shield electrode 41 in recess 40a dispenses with an additional component such as a metal case, thus implementing weight reduction and slimming down.

In this exemplary embodiment, the description is made for the example where plural conductive vias having a land are arranged in a line, for example, but not limited to. For example, a conductive paste containing such as silver (Ag) may be filled in via holes to form conductive vias without a land provided, and additionally the conductive vias may be arranged in a staggered layout. This provides a relay substrate that connects at a finer pitch.

Hereinafter, a description is made for a method of manufacturing relay substrates according to the second exemplary embodiment of the present invention, using FIGS. 5A through 5C and FIGS. 6A through 6C.

FIGS. 5A through 5C and FIGS. 6A through 6C are conceptual diagrams illustrating a method of manufacturing relay substrates according to the second exemplary embodiment of the present invention. Here, a component or part same as that in FIG. 4A through FIG. 4C is described with the same reference mark given.

Figure 5A:
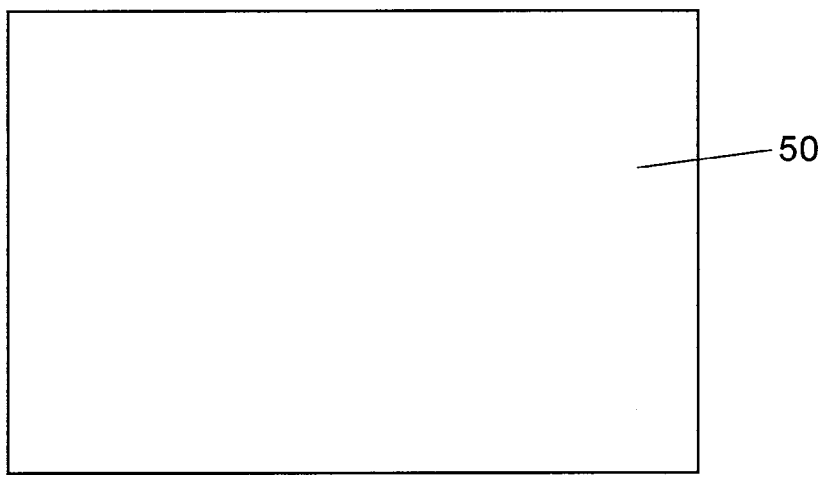
FIG. 5A is a conceptual diagram showing a method of manufacturing relay substrates according to the second exemplary embodiment of the present invention.

First, as shown in FIG. 5A, insulative mother board 50 made of a glass epoxy resin, for example, is prepared.

Figure 5B:
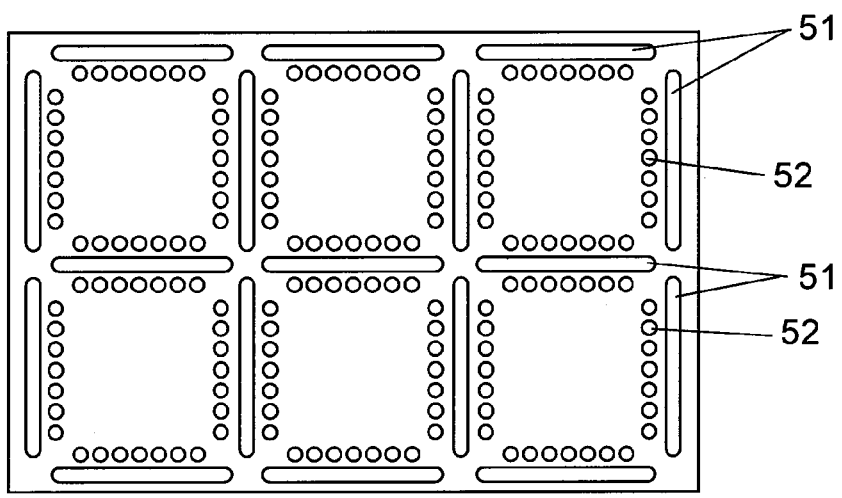
FIG. 5B is a conceptual diagram showing a method of manufacturing relay substrates according to the second exemplary embodiment of the present invention.

Next, as shown in FIG. 5B, plural first holes 51, long-shaped for example, provided in at least a given position are formed by stamping using such as a press machine. Further, plural via holes 52 are formed by stamping using such as a press machine along each side of first hole 51, for example, in insulative mother board 50 inside first hole 51. At this moment, first holes 51 and via holes 52 may be formed either simultaneously or one after another.

Figure 5C:
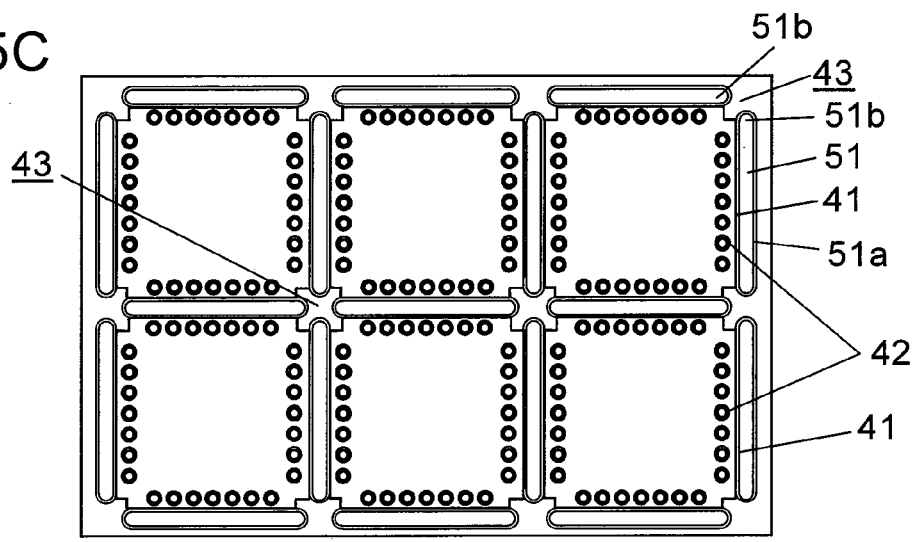
FIG. 5C is a conceptual diagram showing a method of manufacturing relay substrates according to the second exemplary embodiment of the present invention.

Next, as shown in FIG. 5C, shield electrode 41 is formed on inner circumferential side 51a of first hole 51. Then, conductive vias 42 are formed by copper plating or the like in plural via holes 52 formed along each side of first hole 51. Further, ground electrode 43 composed of top-surface ground electrode 43a and bottom-surface ground electrode 43b connected to shield electrode 41 is formed in a given region of the top and bottom surfaces of insulative mother board 50 (e.g. a region where hole end portion 51b of first hole 51 lies next to another).

Here, shield electrodes 41, conductive vias 42, and ground electrodes 43 are formed collectively on insulative mother board 50 by the same method as in the first exemplary embodiment (e.g. by plating method). Here, shield electrodes 41, conductive vias 42, and ground electrodes 43 may be formed either collectively or one after another (i.e. plural steps).

With the above-described method, shield electrode 41 is formed on the inner circumferential side 51a of first hole 51 in insulative mother board 50 by copper plating. Then, conductive vias 42 are formed by such as copper plating in the inner circumferential sides of plural via holes 52 provided along each side of first hole 51, on insulative mother board 50 inside first hole 51. In this case, a land (not shown) is preferably provided around conductive vias 42 in the top and bottom surfaces of insulative mother board 50. As ground electrode 43, top-surface ground electrode 43a and bottom-surface ground electrode 43b are formed in a region (e.g. a region where hole end portion 51b of first hole 51 lies next to another) on the top and bottom surfaces of insulative mother board 50 in a pattern connected to shield electrode 41.

In this exemplary embodiment, the following method may be used. That is, a bond promoting layer (e.g. a combination of an epoxy resin, synthetic rubber, cross-linker, curing agent, and filler) is formed on the top and bottom surfaces of the insulative mother board and on the inner circumferential side of the first holes and via holes, their surfaces are roughened, and then plated. This method improves the adhering strength of plating onto the surface of the insulative mother board.

Alternatively, the patterned surfaces of the shield electrodes, connecting terminal electrodes, and ground electrodes may be gold-plated. This improves the reliability such as the connection stability and moisture resistance.

Figure 6A:
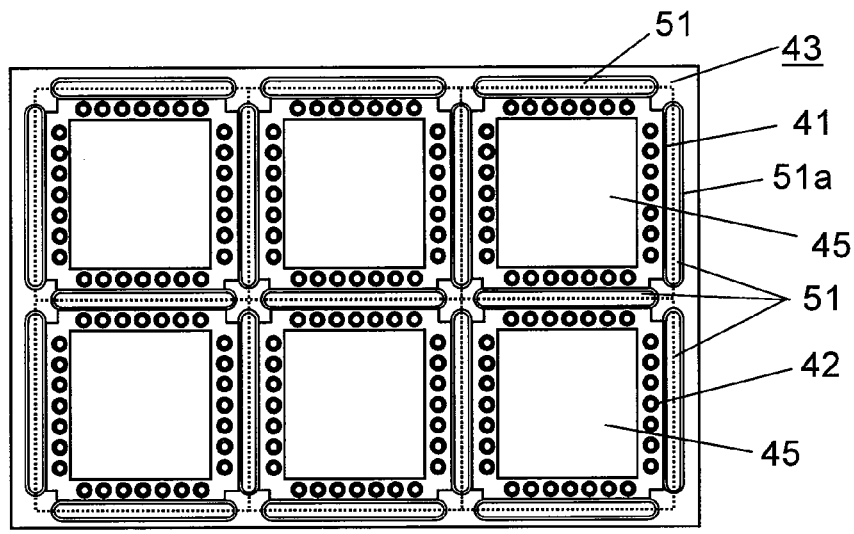
FIG. 6A is a conceptual diagram showing a method of manufacturing relay substrates according to the second exemplary embodiment of the present invention.

Next, as shown in FIG. 6A, second hole 45, quadrangle shape for example, is formed in a region enclosed with plural conductive vias 42 formed in insulative mother board 50, by stamping using such as a press machine.

After that, relay substrates 2 are produced by dividing at a region including at least one second hole 45 along the broken line shown in the drawing, using first hole 51 formed in insulative mother board 50. Here, to divide, a method such as stamping or dicing is used.

Here, forming of second hole 45 and dividing described above may be performed either simultaneously or one after another.

Figure 6B:
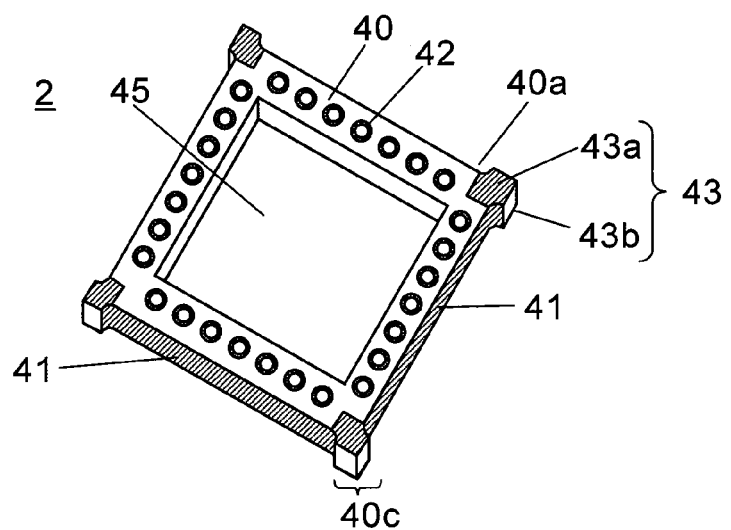
FIG. 6B is a conceptual diagram showing a method of manufacturing relay substrates according to the second exemplary embodiment of the present invention.
Figure 6C:
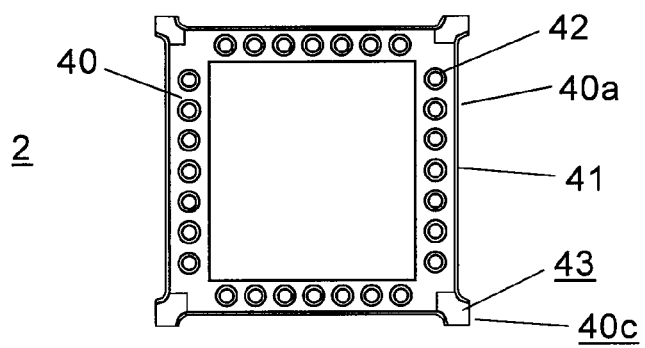
FIG. 6C is a conceptual diagram showing a method of manufacturing relay substrates according to the second exemplary embodiment of the present invention.

Then, as shown in the conceptual perspective view of FIG. 6B and the conceptual plan view of FIG. 6C, the above-described dividing produces plural relay substrates 2 collectively that include shield electrode 41 in recess 40a formed by dividing first holes, that connects between circuit boards (not shown), for example.

By the above-described method, relay substrates 2 are collectively produced that include shield electrode 41 provided in recess 40a of housing 40 formed from an insulative mother board made of a glass epoxy resin; plural conductive vias 42; and ground electrode 43 connected to shield electrode 41. Here, ground electrode 43 is preferably provided on projection part 40c formed by dividing insulative mother board 50 in the same way as in the first exemplary embodiment.

According to the second exemplary embodiment of the present invention, relay substrates that connect between different circuit boards through a shield electrode and conductive via are produced with high productivity at low cost by the simple method of dividing an insulative mother board after each electrode is directly formed on the board.

In this exemplary embodiment, the description is made assuming a first hole is long-shaped and a second hole is quadrangle shape such as a square, but not limited to. They may be appropriately designed holes such as a polygon, a polygon with rounded vertexes, round shape, or ellipsoidal shape, where the same advantages are available.

In this exemplary embodiment, the description is made for the example where conductive vias which will be connecting terminal electrodes have a land formed around the via holes, but not limited to. For example, a conductive paste containing such as silver (Ag) may be filled in via holes and thermoset to form conductive vias. This method dispenses with specially forming a land, thereby providing conductive vias at a fine pitch. Further, the simple method of filling via holes with a conductive paste and thermosetting improve the productivity.

In this exemplary embodiment, an insulative protective film such as a resist may be provided on a part excluding that electrically connected with conductive vias and ground electrodes formed in the housing of the relay substrate. This prevents a short circuit caused by migration and damage to the electrodes at mounting and during storage.

Third Exemplary Embodiment

Figure 7A:
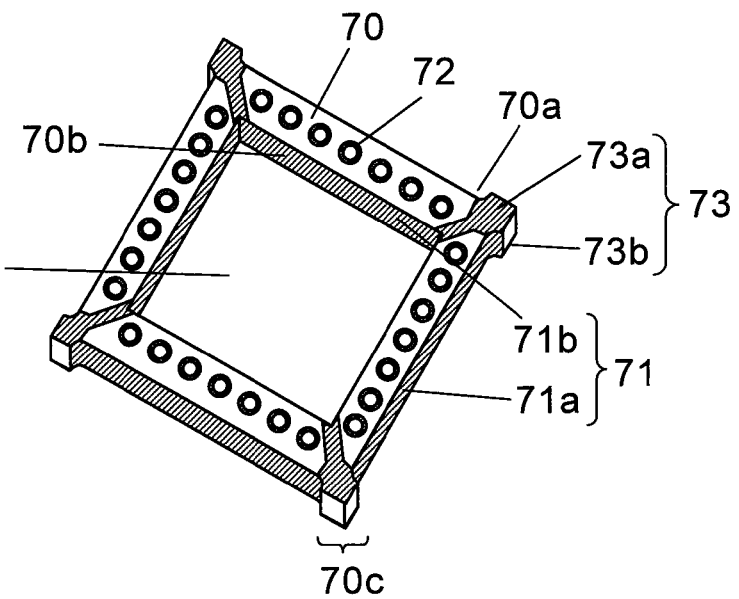
FIG. 7A is a conceptual perspective view showing the configuration of a relay substrate according to the third exemplary embodiment of the present invention.
Figure 7B:
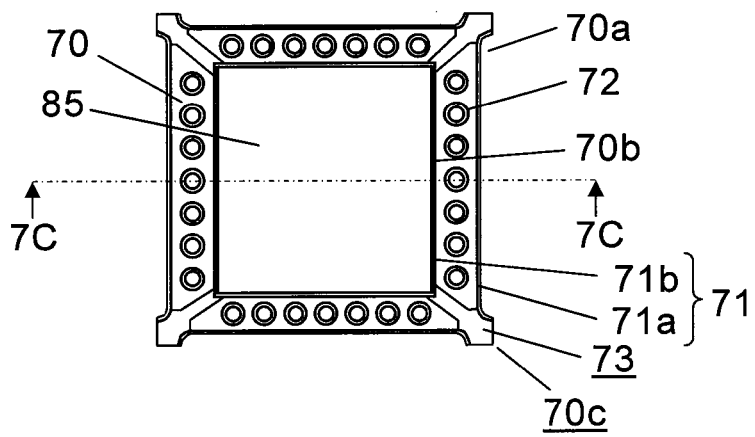
FIG. 7B is a conceptual plan view of FIG. 7A.
Figure 7C:
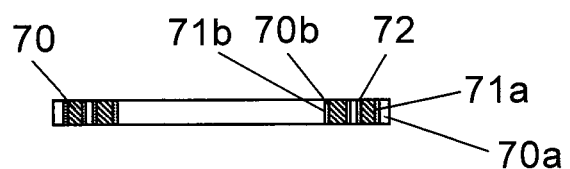
FIG. 7C is a conceptual sectional view of FIG. 7B taken along line 7C-7C.

FIG. 7A is a conceptual perspective view showing the configuration of a relay substrate according to the third exemplary embodiment of the present invention. FIG. 7B is a conceptual plan view of FIG. 7A. FIG. 7C is a conceptual sectional view of FIG. 7B taken along line 7C-7C.

As shown in FIGS. 7A through 7C, relay substrate 3, having an outer circumference, quadrangle shape for example, includes recess 70a formed by dividing using a first hole described in the following manufacturing method; and housing 70 having second hole 85, quadrangle shape for example, made of such as a glass epoxy resin. Then, shield electrode 71 is provided by first shield electrode 71a formed on the entire inner circumferential side of recess 70a; and second shield electrode 71b formed on inner circumferential side 70b of second hole 85. Ground electrode 73 composed of top-surface ground electrode 73a and bottom-surface ground electrode 73b connected to shield electrode 71 composed of first shield electrode 71a and second shield electrode 71b is provided on projection part 70c in given regions at four corners, for example, of relay substrate 3. Further, housing 70 is provided in given positions with plural conductive vias 72 which will be connecting terminal electrodes connecting between its top and bottom surfaces.

That is to say, this exemplary embodiment is different from the second exemplary embodiment in that inner circumferential side 70b of second hole 85 is provided thereon with second shield electrode 71b. First shield electrode 71a corresponds to shield electrode 11 in the first exemplary embodiment.

Housing 70, shield electrode 71, and ground electrode 73, of relay substrate 3 are formed from the same material by the same method as in the first exemplary embodiment. Conductive via 72 is formed from the same material by the same method as in the second exemplary embodiment.

Here, conductive vias 72 which will be connecting terminal electrodes are provided so as to electrically connect the top and bottom surfaces of housing 70 through via holes (not shown) formed between second holes 85 provided in the outer and inner circumferences of housing 70. Then, conductive vias 72 are formed in via holes having a land (not shown) on the top and bottom surfaces of housing 70 by copper plating or the like.

With the above-described method, relay substrate 3 is produced that has a high electromagnetic shielding effect by shield electrode 71 composed of first shield electrode 71a formed in recess 70a of relay substrate 3 that connects between circuit boards through conductive via 72 and ground electrode 73 with relay substrate 3 placed therebetween; and of second shield electrode 71b formed on the inner circumferential side of second hole 85.

Shield electrode 71 composed of first shield electrode 71a and second shield electrode 71b of relay substrate 3 electromagnetically shields a circuit component mounted on a circuit board, for example, in conductive via 72 and second hole 85 formed in housing 70 of relay substrate 3, thereby preventing the electromagnetic wave interference between a signal transmitted through a conductive via and such as noise from a circuit component. Further, doubly shielding a circuit component mounted on a circuit board with first shield electrode 71a and second shield electrode 71b provides higher shielding performance.

Here, conductive via 72 and ground electrode 73 of relay substrate 3 are connected with circuit boards through such as solder, an anisotropic conductive sheet, or anisotropic conductive resin, thereby connecting between circuit boards with high reliability.

In this exemplary embodiment, the description is made for the example where plural conductive vias having a land are arranged in a line, for example, but not limited to. For example, a conductive paste containing such as silver (Ag) may be filled in via holes to form conductive vias without a land provided, and additionally the conductive vias may be arranged in a staggered layout. This provides a relay substrate that connects at a finer pitch.

Relay substrate 3 provided with shield electrode 71 in recess 70a and on inner circumferential side 70b of second hole 85 dispenses with an additional component such as a metal case, thus implementing weight reduction and slimming down.

Hereinafter, a description is made for a method of manufacturing relay substrates 3 according to the third exemplary embodiment of the present invention, using FIGS. 8A through 8C and FIG. 9A.

FIGS. 8A through 8C and FIGS. 9A through 9C are conceptual diagrams illustrating a method of manufacturing relay substrates according to the third exemplary embodiment of the present invention. Here, a component or part same as that in FIG. 7A to FIG. 7C is described with the same reference mark given to be partially omitted.

Figure 8A:
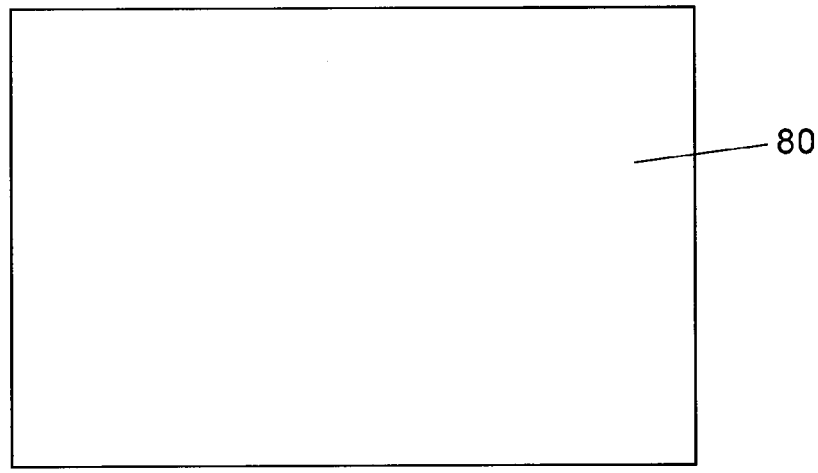
FIG. 8A is a conceptual diagram showing a method of manufacturing relay substrates according to the third exemplary embodiment of the present invention.

First, as shown in FIG. 8A, insulative mother board 80 made of a glass epoxy resin, for example, is prepared.

Figure 8B:
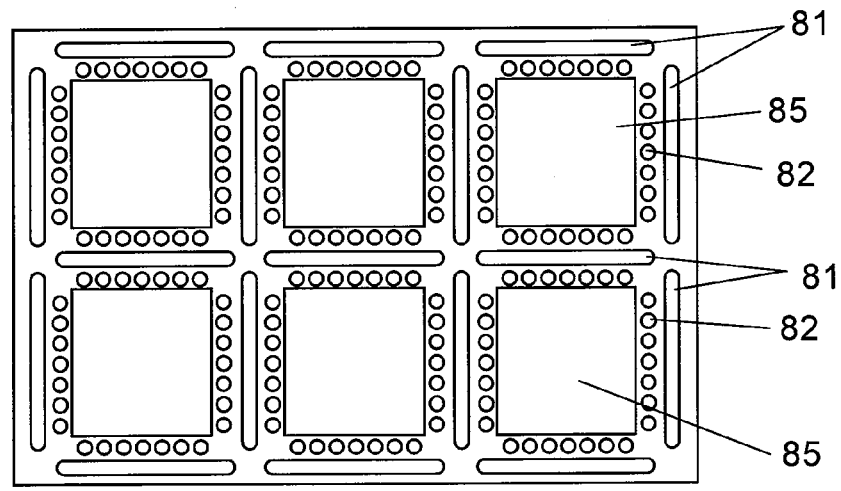
FIG. 8B is a conceptual diagram showing a method of manufacturing relay substrates according to the third exemplary embodiment of the present invention.

Next, as shown in FIG. 8B, plural first holes 81, long-shaped for example, provided in at least a given position are formed by stamping using such as a press machine. Then, second holes 85, quadrangle for example, enclosed with first holes 81 are formed by stamping using such as a press machine. Further, plural via holes 82 are formed by stamping using such as a press machine in insulative mother board 80 enclosed with first holes 81 and second hole 85. At this moment, first holes 81, second hole 85, and via hole 82 may be formed either simultaneously or one after another.

Figure 8C:
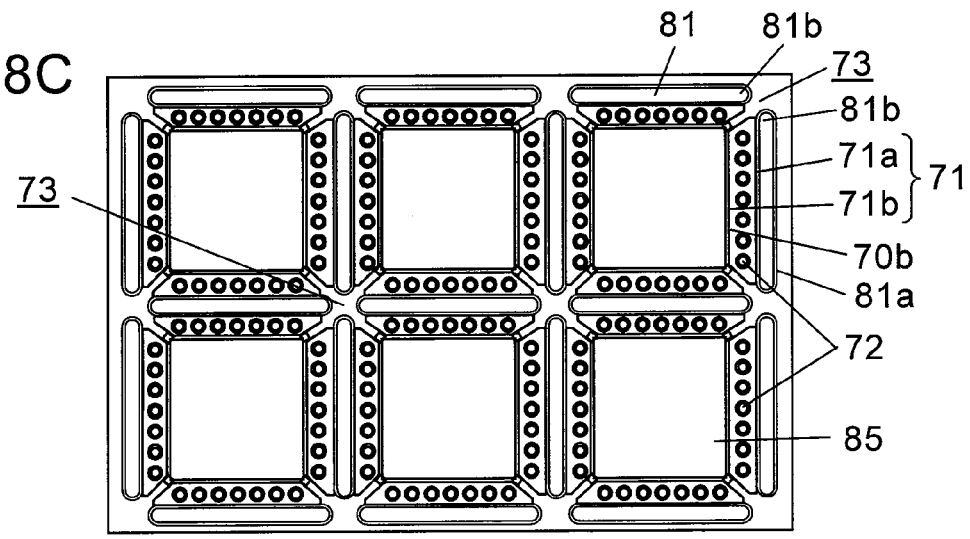
FIG. 8C is a conceptual diagram showing a method of manufacturing relay substrates according to the third exemplary embodiment of the present invention.

Next, as shown in FIG. 8C, shield electrode 71 is formed by first shield electrode 71a on inner circumferential side 81a of first hole 81 and second shield electrode 71b on inner circumferential side 70b of second hole 85. Conductive vias 72 are formed by copper plating or the like in plural via holes 82 formed in a region sandwiched between first hole 81 and second hole 85. Further, ground electrode 73 is formed by top surface ground electrode 73a and bottom-surface ground electrode 73b connected to shield electrode 71, in given regions of the top and bottom surfaces of insulative mother board 80 (e.g. a region where hole end portion 81b of first hole 81 lies next to another).

Here, shield electrode 71, conductive via 72, and ground electrode 73 are collectively formed on insulative mother board 80 by the same method as in the second exemplary embodiment (e.g. by plating method). Here, shield electrode 71, conductive via 72, and ground electrode 73 may be formed either collectively or one after another (i.e. plural steps).

By the above-described method, shield electrode 71 is formed on the inner circumferential side 81a of first hole 81 and on inner circumferential side 70b of second hole 85, in insulative mother board 80 by copper plating. Then, conductive via 72 is formed by such as copper plating on the inner circumferential side of plural via holes 82 formed in a region sandwiched between first hole 81 and second hole 85. In this case, a land (not shown) is preferably provided around conductive vias 72 on the top and bottom surfaces of insulative mother board 80. As ground electrode 73, top-surface ground electrode 73a and bottom-surface ground electrode 73b are formed in a region (e.g. a region enclosed with plural long-shaped hole end portions 81b of first holes 81 and second hole 85) on the top and bottom surfaces of insulative mother board 80 in a pattern connected to shield electrode 71.

In this exemplary embodiment, the following method may be used. That is, a bond promoting layer (e.g. a combination of an epoxy resin, synthetic rubber, cross-linker, curing agent, and filler) is formed on the top and bottom surfaces of the insulative mother board and on the inner circumferential side of the first holes and via holes, their surfaces are roughened, and then plated. This method improves the adhering strength of plating onto the surface of the insulative mother board.

Further, the patterned surfaces of the shield electrodes, connecting terminal electrodes, and ground electrodes may be gold-plated. This improves reliability such as the connection stability and moisture resistance.

Figure 9A:
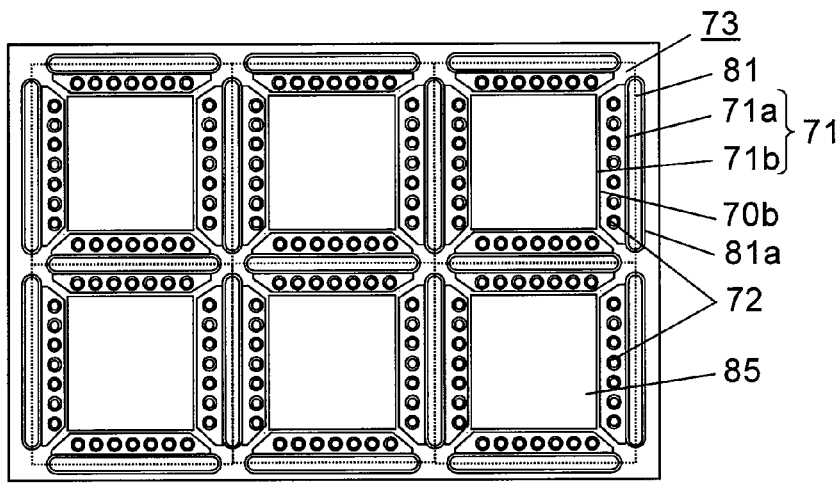
FIG. 9A is a conceptual diagram showing a method of manufacturing relay substrates according to the third exemplary embodiment of the present invention.

Next, as shown in FIG. 9A, relay substrates 3 are produced by dividing at a region including at least one second hole 85 along the broken line shown in the drawing, using first hole 81 formed in insulative mother board 80. Here, to divide, a method such as stamping or dicing is used.

Figure 9B:
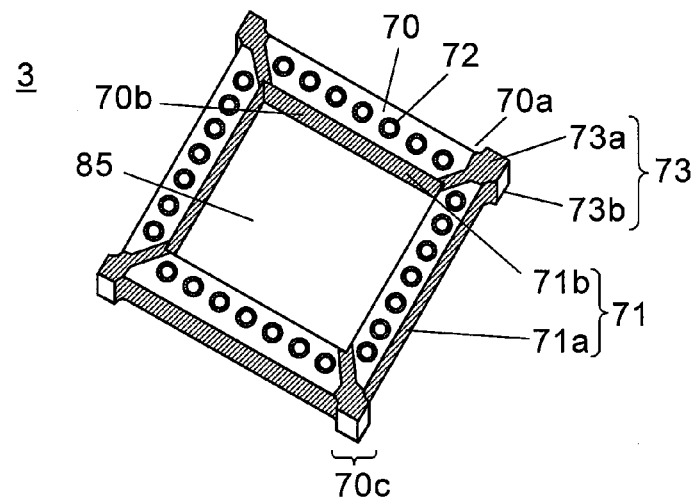
FIG. 9B is a conceptual diagram showing a method of manufacturing relay substrates according to the third exemplary embodiment of the present invention.
Figure 9C:
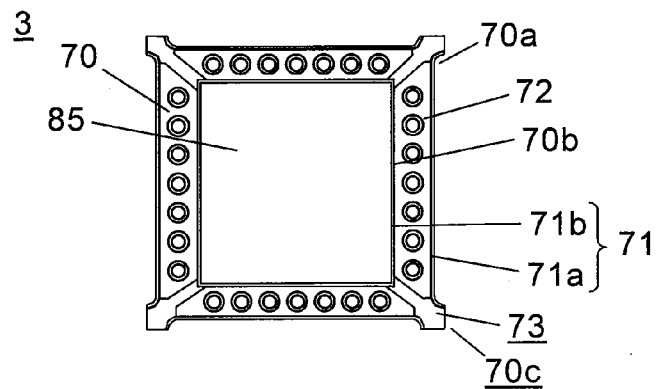
FIG. 9C is a conceptual diagram showing a method of manufacturing relay substrates according to the third exemplary embodiment of the present invention.

Then, as shown in the conceptual perspective view of FIG. 9B and the conceptual plan view of FIG. 9C, the above-described dividing produces plural relay substrates 3 collectively that have shield electrode 71 composed of first shield electrode 71a and second shield electrode 71b that connects between circuit boards, for example.

By the above-described method, relay substrates 3 are collectively produced that include shield electrode 71 composed of first shield electrode 71a provided in recess 70a of housing 70, formed from an insulative mother board made of a glass epoxy resin, and of second shield electrode 71b provided in second hole 85; plural conductive vias 72; and ground electrode 73 connected to shield electrode 71. Here, ground electrode 73 is preferably provided near projection part 70c formed by dividing insulative mother board 80 in the same way as in each exemplary embodiment described above.

According to the third exemplary embodiment of the present invention, relay substrates that connect between different circuit boards through a shield electrode composed of first and second shield electrodes and through a conductive via are produced with high productivity at low cost by the simple method of dividing an insulative mother board after each electrode is directly formed on the insulative mother board.

In this exemplary embodiment, the description is made assuming a first hole is long-shaped and a second hole is quadrangle shape such as a square, but not limited to. They may be appropriately designed holes such as a polygon, a polygon with rounded vertexes, round shape, or ellipsoidal shape, where the same advantages are available.

In this exemplary embodiment, the description is made for the example where conductive vias have a land formed around the via holes, but not limited to. For example, a conductive paste containing such as silver (Ag) may be filled in via holes and thermoset to form conductive vias. This method dispenses with specially forming a land, thereby providing conductive vias at a fine pitch. Further, the simple method of filling via holes with a conductive paste and thermosetting improve the productivity.

In this exemplary embodiment, the description is made for the example where each electrode is formed using photolithographic technique and etching technique by a combination of electroless plating and electrolytic plating, but not limited to. Any method can be applied without any particular restrictions as long as it pattern-forms with such as a given film thickness.

In this exemplary embodiment, an insulative protective film such as a resist may be provided on a part excluding that electrically connected with conductive vias formed in the housing of the relay substrate and ground electrodes. This prevents a short circuit caused by migration and damage to the electrodes at mounting and during storage.

Fourth Exemplary Embodiment

Figure 10A:
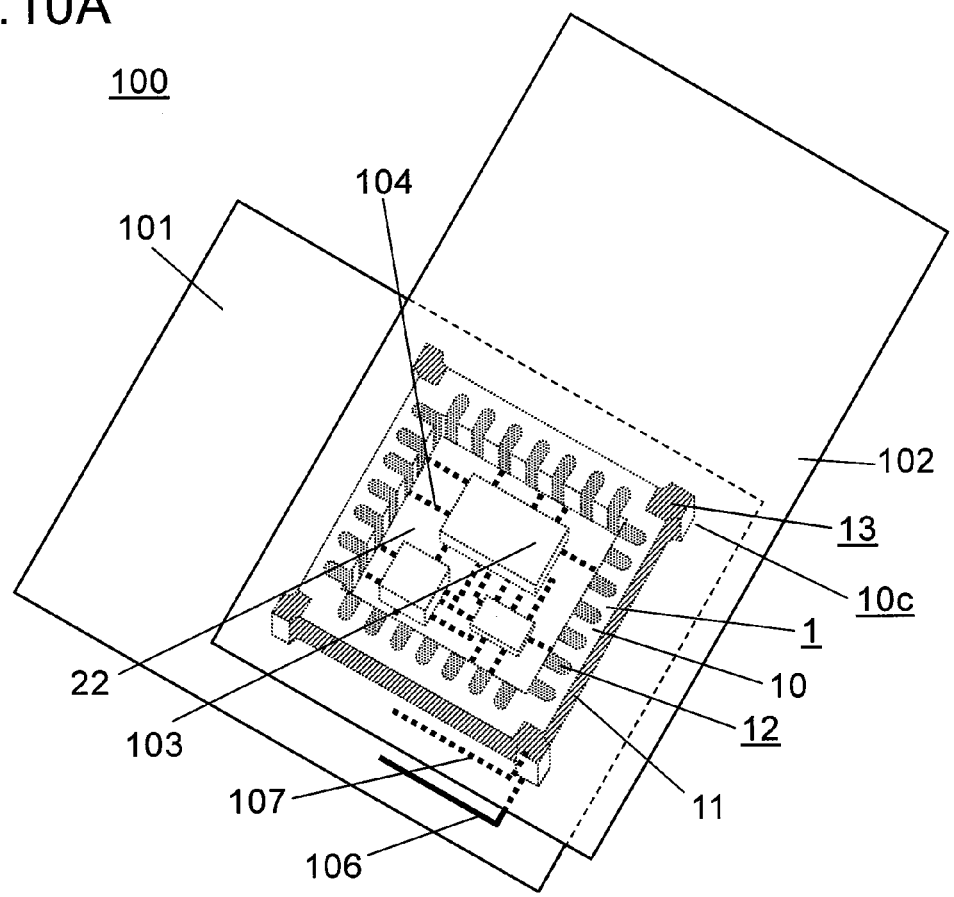
FIG. 10A is a conceptual perspective view showing the configuration of a three-dimensional circuit device according to the fourth exemplary embodiment of the present invention.
Figure 10B:
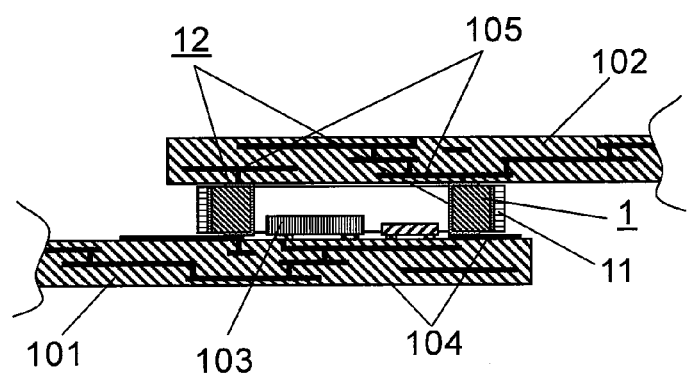
FIG. 10B is an enlarged conceptual sectional view of a part connecting between circuit boards shown in FIG. 10A through a relay substrate.
Figure 11:
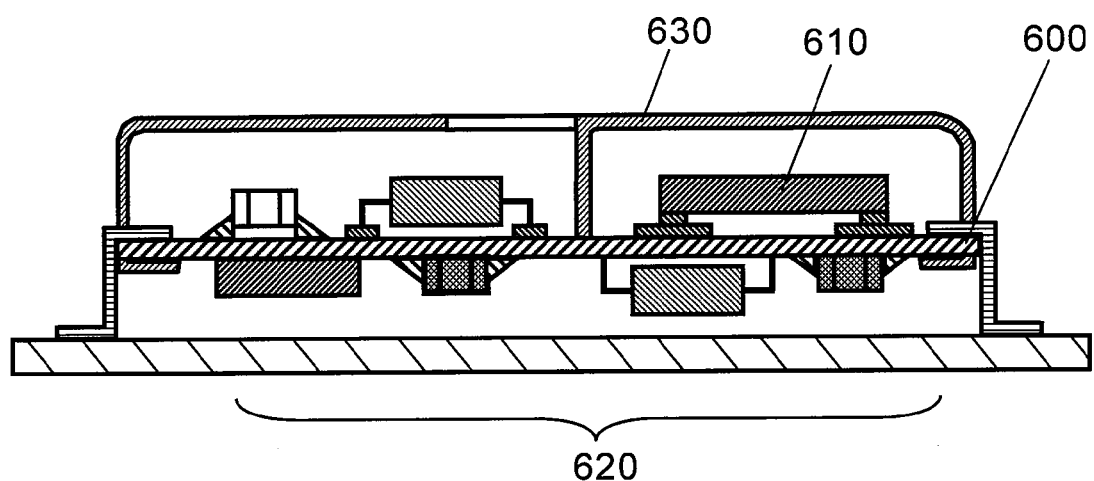
FIG. 11 is a sectional view showing the configuration of the shielding structure of a conventional printed-circuit board.

FIG. 10A is a conceptual perspective view showing the configuration of a three-dimensional circuit device according to the fourth exemplary embodiment of the present invention. FIG. 10B is an enlarged conceptual sectional view of a part connecting between the circuit boards shown in FIG. 10A through a relay substrate. Hereinafter, a description is made using relay substrate 1 described in the first exemplary embodiment, with the same reference mark given to a component or part same as that in relay substrate 1. In FIG. 10A, a part of the wiring patterns of the circuit board is omitted and the relay substrate sandwiched between circuit boards is shown perspectively.

As shown in FIGS. 10A, 10B, three-dimensional circuit device 100 is structured so that first circuit board 101 and second circuit board 102 are provided facing each other with relay substrate 1 placed therebetween.

Here, first circuit board 101 has circuit component 103 composed of an IC chip such as a high-frequency circuit connected to a connecting terminal (not shown) of wiring pattern 104 formed on first circuit board 101, by soldering for example, and mounted on a given position so as to be contained in second hole 22 of relay substrate 1.

Then, connecting terminal electrode 12 provided on relay substrate 1 is connected to given wiring patterns 104, 105 provided on first circuit board 101 and second circuit board 102, by soldering for example. Ground electrode 13 provided on relay substrate 1 and ground wiring patterns 106, 107 provided on first circuit board 101 and second circuit board 102 are grounded at the ground potential.

Ground electrode 13 is further connected to shield electrode 11 provided on relay substrate 1. This efficiently shields circuit component 103 and connecting terminal electrode 12 included in relay substrate 1 from external noise; and shields radiating of internal noise generated by circuit component 103 from the inside of relay substrate 1 to the outside.

This exemplary embodiment implements a three-dimensional circuit device slim and highly reliable free from malfunction caused by such as noise, by connecting between circuit boards through a relay substrate including a shield electrode.

The low-cost relay substrate superior in productivity provides an inexpensive three-dimensional circuit device.

In this exemplary embodiment, the description is made for the example where circuit components are mounted on the first circuit board, but not limited to. For example, circuit components may be mounted on the second circuit board or on both first and second circuit boards, which allows mounting a large number of circuit components requiring shielding.

In this exemplary embodiment, the description is made using relay substrate 1 of the first exemplary embodiment, but a relay substrate in each exemplary embodiment described above may be used, where the same advantages are provided.

In this exemplary embodiment, the description is made for the example where two circuit boards are connected through a relay substrate, but not limited to. For example, three or more circuit boards may be connected in multiple stages through a relay substrate for each pair of circuit boards, where the same advantages are provided.

Here, in each exemplary embodiment described above, the description is made for the example where relay substrates are produced by dividing an insulative mother board at a region including one second hole, but not limited to. For example, the insulative mother board may be divided at a region including two or more second holes using a first hole.

This method independently shields circuit components requiring shielding to prevent electromagnetic wave interference. Separately relaying between plural circuit boards supports complicated circuit board arrangements. Further, the method implements a structure with improved mechanical strength and easy handling of the relay substrates.

In each exemplary embodiment described above, the description is made for the example where connecting terminal electrodes and conductive vias are provided on the entire circumference so as to enclose the periphery of second holes, but not limited to. For example, they may be provided partially on one side, sides mutually facing, or three sides of a quadrangle shape housing.

Industrial Applicability

With the relay substrate, the method of manufacturing such relay substrates, and the three-dimensional circuit device using the relay substrate, according to the present invention, circuit boards can be connected through a slim relay substrate with high noise immunity, which means the invention is useful in the technical field for such as mobile information devices and small electronic devices requiring high speed driving and reduction in size and profile.

The invention claimed is:

1. A relay substrate comprising:
    a housing of quadrangle shape having a hole and projection parts positioned at four corners;
    a plurality of connecting terminal electrodes provided continuously on top and bottom surfaces of the housing and on an inner circumference of the hole;
    a shield electrode provided on an entire surface of an outer circumferential side of the housing except for the projection parts at the four corners; and
    a ground electrode provided on portions of the projections parts at the four corners positioned on the top and bottom surfaces of the housing, and connected to the shield electrode.

2. The relay substrate of claim 1, wherein the connecting terminal electrode is provided on the top and bottom surfaces of the housing through the inner circumferential side of the hole.

3. The relay substrate of claim 1, wherein the connecting terminal electrode is composed of a conductive via through the top and bottom surfaces of the housing.

4. A three-dimensional circuit device wherein the device is connected between at least a first circuit board and a second circuit board through the relay substrate of claim 1.

5. The three-dimensional circuit device of claim 4, wherein a circuit component is implemented on at least one of the first circuit board and the second circuit board.

6. A relay substrate connecting between at least a first circuit board and a second circuit board, comprising:
    a housing having a recess provided in an outer circumference and a hole provided in an inner circumference;
    a plurality of connecting terminal electrodes connecting between top and bottom surfaces of the housing;
    a first shield electrode provided in the recess; and
    a ground electrode provided on a part of the top and bottom surfaces of the housing, and connected to the first shield electrode,
    wherein, a second shield electrode is provided on the inner circumferential side of the hole.

7. A three-dimensional circuit device wherein the device is connected between at least a first circuit board and a second circuit board through the relay substrate of claim 6.

8. The three-dimensional circuit device of claim 7, wherein a circuit component is implemented on at least one of the first circuit board and the second circuit board.

* * * * *